United States Patent
Chan et al.

(10) Patent No.: US 9,401,711 B2
(45) Date of Patent: Jul. 26, 2016

(54) DRIVER OUTPUT WITH DYNAMIC SWITCHING BIAS

(71) Applicant: International Business Machines Corporation, Armonk, NY (US)

(72) Inventors: Francis Chan, Williston, VT (US); Bo Qu, Shanghai (CN); Si Shi, Shanghai (CN); Songtao Xu, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 98 days.

(21) Appl. No.: 14/541,713

(22) Filed: Nov. 14, 2014

(65) Prior Publication Data

US 2016/0142051 A1    May 19, 2016

(51) Int. Cl.
*H03K 3/00* (2006.01)
*H03K 17/687* (2006.01)

(52) U.S. Cl.
CPC ................................. *H03K 17/6872* (2013.01)

(58) Field of Classification Search
None
See application file for complete search history.

(56) References Cited

U.S. PATENT DOCUMENTS

| | | | |
|---|---|---|---|
| 5,804,998 A | 9/1998 | Cahill et al. | |
| 6,643,110 B2 | 11/2003 | Allen | |
| 6,970,024 B1 | 11/2005 | Reese et al. | |
| 6,977,447 B2 | 12/2005 | May | |
| 8,166,286 B2 * | 4/2012 | Frank | G06F 9/3869 327/199 |
| 8,686,758 B1 * | 4/2014 | Sia | H03K 19/018521 326/82 |
| 8,766,675 B1 * | 7/2014 | Dreps | H02H 9/046 327/112 |
| 2003/0189448 A1 * | 10/2003 | Boemler | H03K 17/163 327/112 |
| 2007/0024325 A1 * | 2/2007 | Chen | G11C 7/04 327/55 |
| 2011/0316610 A1 * | 12/2011 | Stockinger | H03K 17/102 327/437 |
| 2012/0119783 A1 * | 5/2012 | Jung | H03K 3/356156 326/58 |
| 2014/0253197 A1 * | 9/2014 | Vilangudipitchai | H03K 3/012 327/212 |
| 2014/0268463 A1 * | 9/2014 | Dreps | H03K 17/04 361/91.1 |
| 2015/0084694 A1 * | 3/2015 | Lee | H03F 3/301 330/255 |

OTHER PUBLICATIONS

Connor et al., "Dynamic Dielectric Protection for I/O Circuits Fabricated in a 2.5V CMOS Technology Interfacing to a 3.3V LVTTL Bus", IBM Microelectronics Division, Essex Junction, VT, 1997 Symposium on VLSI Circuits Digest of Technical Papers, pp. 119-120.

* cited by examiner

*Primary Examiner* — Lincoln Donovan
*Assistant Examiner* — Khareem E Almo
(74) *Attorney, Agent, or Firm* — Gibb & Riley, LLC; Steven J. Meyers, Esq.

(57) ABSTRACT

A circuit of an output stage of a push-pull driver having dynamic biasing may include a stacked configuration of field effect transistors (PFETs) having a first PFET, a second PFET, and a third PFET, whereby the first PFET is connected to a first supply voltage, the third PFET is connected to an output of a switchable voltage bias generator circuit, and the second PFET is electrically connected between the first PFET and the third PFET. A transmission gate may be connected to a second supply voltage, whereby the transmission gate electrically connects the second supply voltage to an electrical connection between the first PFET and the second PFET based on a first operating state for preventing a voltage breakdown condition associated with the stacked configuration of PFETs. The third PFET is bias controlled via the switching of the output of the switchable voltage bias generator circuit.

20 Claims, 4 Drawing Sheets

DRIVER OUTPUT WITH DYNAMIC SWITCHING BIAS

BACKGROUND

The present invention generally relates to complementary metal oxide semiconductor (CMOS) field effect transistor (FET) devices, and more particularly, to voltage push pull driver output stages with dynamic voltage switching.

Current CMOS technology may utilize 1.5V power supplies due to device scaling and power saving. The 1.5V power supply devices have a lower breakdown threshold voltage relative to, for example, 1.8V power supply devices. However, the devices utilizing a 1.5V power supply may provide increased performance due to having a lower voltage supply.

Reliability breakdown may include a gate dielectric oxide breakdown and parasitic bipolar breakdown occurring as a result of exceeding a device breakdown threshold voltage. Such limitations associated with lower power supply voltage devices, such as 1.5V FETs, may present challenges in using 1.5V FET CMOS devices in supporting legacy 3.3V LVTTL CMOS designs within a single circuit.

A 3.3V push pull driver output stage may require the stacking of two 1.8V CMOS p-channel field effect transistor (PFET) for a voltage pull up and two 1.8V CMOS n-channel field effect transistor (NFET) for a voltage pull down. Each of these 1.8V CMOS FET has a dielectric breakdown voltage of about 1.95V as opposed to a lower 1.6V breakdown voltage for a 1.5V CMOS device. However, a two device stacking topology may no longer be supported by 1.5V CMOS devices. This may occur as a result of the 1.5V CMOS devices having a substantially lower breakdown voltage and, therefore, being more susceptible to damage.

SUMMARY

According to one or more embodiments, a three device 1.5V complementary metal oxide semiconductor (CMOS) field effect transistor (FET) stacking scheme for a driver output stage may be utilized to support legacy 3.3V CMOS driver designs. This may include the stacking of three PFETs for a pull up portion of the driver circuit and three NFETs for a pull down portion of the driver circuit. This driver may use two sets of stacked CMOS FET devices to alternate between voltage levels (0V and 3.3V) while dynamically biasing these stacked CMOS FET devices (e.g., 1.5V FETs) to avoid dielectric breakdown and parasitic bipolar breakdown at voltages greater than about 1.5V (e.g., 1.6V).

According to one embodiment, a circuit of an output stage of a push-pull driver having dynamic biasing is provided. The circuit may include a first stacked configuration of p-type field effect transistors (PFETs) having a first PFET, a second PFET, and a third PFET, whereby the first PFET is connected to a first supply voltage, the third PFET is connected to an output of a first switchable voltage bias generator circuit, and the second PFET is electrically connected between the first PFET and the third PFET. A first transmission gate may be connected to a second supply voltage, whereby the first transmission gate electrically connects the second supply voltage to an electrical connection between the first PFET and the second PFET based on a first operating state for preventing a first voltage breakdown condition associated with the first stacked configuration of PFETs. The third PFET is bias controlled via the switching of the output of the first switchable voltage bias generator circuit.

According to another embodiment, a circuit of an output stage of a push-pull driver having dynamic biasing is provided. The circuit may include a second stacked configuration of n-type field effect transistors (NFETs) may include a first NFET, a second NFET, and a third NFET, whereby the first NFET is connected to a ground voltage, the third NFET is connected to the output of the first switchable voltage bias generator circuit, and the second NFET is electrically connected between the first NFET and the third NFET. A second transmission gate may be connected to a third supply voltage, whereby the second transmission gate electrically connects the third supply voltage to an electrical connection between the first NFET and the second NFET based on a second operating state for preventing a second voltage breakdown condition associated with the second stacked configuration of NFETs. The third NFET in the second stacked configuration of n-type NFETs is bias controlled via the switching of the output of the first switchable voltage bias generator circuit.

According to yet another embodiment, a design structure tangibly embodied in a machine readable medium for designing, manufacturing, or testing an integrated circuit is provided. The design structure may include a circuit of an output stage of a push-pull driver having dynamic biasing. The circuit of the output stage may include a first stacked configuration of p-type field effect transistors (PFETs) having a first PFET, a second PFET, and a third PFET, whereby the first PFET is connected to a first supply voltage, the third PFET is connected to an output of a first switchable voltage bias generator circuit, and the second PFET is electrically connected between the first PFET and the third PFET. A first transmission gate may be connected to a second supply voltage, whereby the first transmission gate electrically connects the second supply voltage to an electrical connection between the first PFET and the second PFET based on a first operating state for preventing a first voltage breakdown condition associated with the first stacked configuration of PFETs. The third PFET is bias controlled via the switching of the output of the first switchable voltage bias generator circuit. A second stacked configuration of n-type field effect transistors (NFETs) may include a first NFET, a second NFET, and a third NFET, whereby the first NFET is connected to a ground voltage, the third NFET is connected to the output of the first switchable voltage bias generator circuit, and the second NFET is electrically connected between the first NFET and the third NFET. A second transmission gate may be connected to a third supply voltage, whereby the second transmission gate electrically connects the third supply voltage to an electrical connection between the first NFET and the second NFET based on a second operating state for preventing a second voltage breakdown condition associated with the second stacked configuration of NFETs. The third NFET in the second stacked configuration of n-type NFETs is bias controlled via the switching of the output of the first switchable voltage bias generator circuit.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1A:
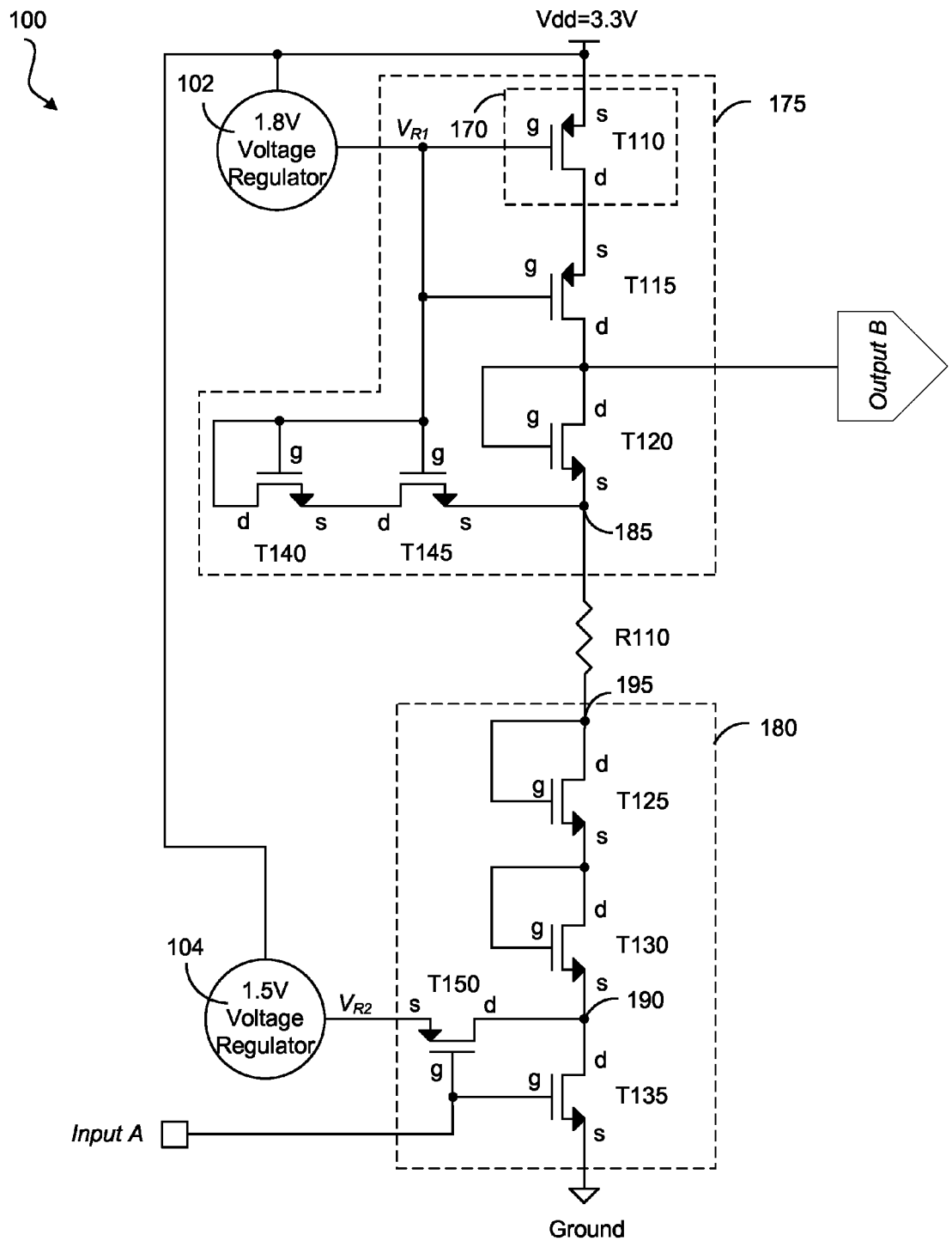
FIG. 1a is a switchable voltage bias generator circuit, according to one exemplary embodiment.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

References in the specification to "an embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

The following describes an exemplary embodiment of a circuit which may be used to drive 3.3V legacy driver designs within, for example, an integrated circuit, using lower voltage 1.5V complementary metal oxide semiconductor (CMOS) field effect transistors (FETs). Accordingly, the following described circuit embodiments provide for the biasing of the output stage of a push pull output driver.

In the following paragraphs and corresponding figures, the source of each FET may be shown with an 's' in the figures. The drain of each FET may be shown with a 'd' in the figures, and the gate of each FET may be shown as a 'g' in the figures. For example, as depicted in FIG. 1a, the box 170 depicts transistor T110 showing the gate, source and drain of this transistor depicted by 'g', 's' and 'd', respectively.

Referring now to FIG. 1a, a switchable voltage bias generator circuit 100 is depicted. The switchable voltage bias generator circuit 100 may include a regulated power supply source 102 (e.g., 1.8V Voltage Regulator), that generates 1.8V, a regulated power supply source 104 (e.g., 1.5V Voltage Regulator) that generates 1.5V, a first three stack FET circuit 175, a second three stack FET circuit 180 and a resistor R110 coupled between the first three stack FET circuit 175 and the second three stack FET circuit 180.

The first three stack FET circuit 175 may include PFETs T110 and T115, and NFETs T120, T140 and T145. PFET T110 and PFET T115 are serially coupled, whereby the source 's' of PFET T110 is connected to the 3.3V supply voltage, the drain 'd' of PFET T110 is connected to the source 's' of PFET T115, and the gate 'g' of PFET 110 is connected to the regulated output voltage $V_{R1}$ (i.e., 1.8V) of regulated power supply source 102. Regulated power supply source 102 is a 1.8V voltage regulated from the 3.3V supply voltage. Also, the source 's' of PFET T115 is connected to the drain 'd' of PFET T110, the drain 'd' of PFET T115 is connected to both the drain 'd' and gate 'g' of PFET T120, and the gate 'g' of PFET T115 is connected to the regulated output voltage (i.e., 1.8V) of regulated power supply source 102 and the gate 'g' of PFET T110.

Still referring to the first three stack FET circuit 175 of FIG. 1a, the drain 'd' and gate 'g' of NFET T120 are both connected to the drain 'd' of PFET T115. The source 's' of NFET T120 is connected to the source 's' of NFET T145 and is also connected to one end of the resistor R110 at point 185. As further depicted in FIG. 1a, the drains 'd' of both PFET T115 and NFET T120 are connected together and form Output B of the switchable voltage bias generator circuit 100. The regulated output voltage (i.e., 1.8V) $V_{R1}$ generated by regulated power supply source 102 is received by the gate 'g' of NFET T145. The source 's' of NFET T145 is connected to both the source 's' of NFET T120 and one end of the resistor R110 at point 185. The drain 'd' of NFET T145 is connected to the source 's' of NFET T140. In addition, both the gate 'g' and the drain 'd' of NFET T140 are connected to regulated power supply source 102 and accordingly receive regulated voltage output $V_{R1}$ (i.e., 1.8V). The source 's' of NFET T140 is connected to the drain 'd' of NFET T145. The two NFETs T140 and T145 may be referred to as a transmission gate pair.

As further illustrated in FIG. 1a, the second three stack FET circuit 180 may include NFETs T125, T130 and T135, as well as PFET T150. NFET T125 has a gate 'g' and a drain 'd' that are both connected to resistor R110 at point 195. The source 's' of NFET 125 is connected to the gate 'g' and drain 'd' of NFET T130. NFET T130 is connected serially to NFET T125. The gate 'g' and drain 'd' of NFET T130 are both connected to the source 's' of NFET T125. The source 's' of NFET T130 is connected to both the drain 'd' of PFET T150 and drain 'd' of NFET T135. This connection point is identified as 190. NFET T135 has a drain 'd' that is connected to both the source 's' of NFET T130 and the drain 'd' of PFET T150. The source 's' of T135 is connected to ground. The gates 'g' of NFET T135 and PFET 150 are both connected to Input A. PFET T150 has a source 's' that is connected to the regulated voltage output $V_{R2}$ (i.e., 1.5V) of regulated power supply source 104. Regulated power supply source 104 is a 1.5V voltage regulated from the 3.3V supply voltage. The drain 'd' of PFET T150 is connected at point 190 to both the source 's' of NFET T130 and the drain 'd' of NFET T135. Input A can also be referred to as a control input. PFET T150 may also be referred to as a transmission gate.

In the embodiment of FIG. 1a, inputs of 0V and 1.5V received at Input A may be voltage level shifted to 3.3V and 1.8V at Output B, respectively. For example, when the input is 0V, the switchable voltage bias generator circuit 100 may produce an Output B of 3.3V. Alternatively, when the input is 1.5V, the switchable voltage bias generator circuit 100 may produce an Output B of 1.8V. The operation of the switchable voltage bias generator circuit 100 is described below in more detail.

Generally, an NFET device may be in the ON state when the voltage between the gate and source is greater than the threshold voltage of the device. Otherwise the NFET device may be in an OFF state. A PFET may be in the ON state when the voltage between the gate and source is less than the threshold voltage. Otherwise the PFET device may be in an OFF state.

As shown in Table 1 below, Input A of the switchable voltage bias generator circuit 100 may toggle between 0V (State 1) and 1.5V (State 2). During State 1, when Input A is 0V, the switchable voltage bias generator circuit 100 shown in FIG. 1a may produce 3.3V at Output B. Alternatively, during State 2, when Input A is 1.5V, the switchable voltage bias generator circuit 100 shown in FIG. 1a may generate 1.8V at Output B. States 1 and 2 may be different operating states for the circuits described herein.

TABLE 1

Operational States of the switchable voltage bias generator circuit 100

|  | Input A | Output B |
| --- | --- | --- |
| State 1 | 0 V | 3.3 V |
| State 2 | 1.5 V | 1.8 V |

In the switchable voltage bias generator circuit 100 (FIG. 1a), Output B may be determined by either the first three stack FET circuit 175 or the second three stack FET circuit 180. More specifically, in the first three stack FET circuit 175, as previously indicated, the regulated power supply source 102 (i.e. 1.8V) is connected to both the drain 'd' and gate 'g' of NFET T140. The source 's' of NFET T140 is connected to the drain 'd' of NFET T145. NFET T140 may be OFF for State 1 and ON for State 2. In operation, the gates 'g' of NFET T145 and NFET T140 are both connected to the regulated power supply source 102 (i.e., 1.8V), thus NFETs T140 and T145 are switched ON for State 2 (i.e., Input A=1.5V). A conductive path is then generated between the 1.8V regulated output $V_{R1}$, the drain 'd' of NFET T140, and the source 's' of NFET T145. Thus, NFETs T140 and T145 may insure the point 185 in the switchable voltage bias generator circuit 100 is held at the 1.8V regulated output $V_{R1}$ of the regulated power supply source 102. Holding the source 's' of NFET T120 at 1.8V may thus ensure that the FETs T110, T115, T120 of the first three stack FET circuit 175 do not exceed their respective dielectric breakdown voltage during the operation of the switchable voltage bias generator circuit 100.

Still referring to the first three stack FET circuit 175, the regulated power supply source 102 (i.e., 1.8V) is connected to the gates 'g' of PFETs T110 and T115. The application of this 1.8V gate voltage to PFETs T110 and T115 switches both devices to an ON state. Thus, the 3.3V supply voltage is connected to the drain 'd' of NFET T120, which forms Output B.

During State 1, in which Input A=0V and Output B=3.3V, the switchable voltage bias generator circuit 100 in FIG. 1a may be mostly driven by the operation of the first three stack FET circuit 175. During State 1, the second three stack FET circuit 180 may a negligible influence Output B (i.e., 1.8V) based on the following. In the second three stack FET circuit 180, Input A is connected to the gates 'g' of both PFET T150 and NFET T135. During State 1, when Input A is at 0V, NFET T135 will be in an OFF state (i.e., $V_{gs}$=0V), while PFET T150 is in an ON state (i.e., $V_{gs}$=−1.5V). Point 190 is therefore held at the regulated voltage $V_{R2}$ of 1.5V.

Continuing in State 1, when the gate 'g' of NFET T120 is at 3.3V based on PFETs T110 and T115 being ON, Output B is at 3.3V. Also, NFET T120 is in an ON state, which in turn maintains PFETs T140 and T145 in an OFF state.

NFET T125 has its drain 'd' and gate 'g' connected to point 195. At point 195, the voltage drop across resistor R110 may be controlled to maintain a voltage drop across NFET T120, R110, NFET T125 and NFET T130. This voltage drop, from approximately 3.3V at Output B to approximately 1.5V at point 190, maintains a voltage drop across each FET which is less than the breakdown voltage. This will avoid dielectric breakdown and parasitic bipolar breakdown across the FET devices. NFET T125 is in turn switched ON and NFET T130 is switched ON. However, as previously described, NFET T135 is held in an OFF state during State 1 (i.e., Input A=0V), which maintains Output B is at the desired voltage (i.e., 3.3V).

As previously mentioned, the second three stack FET circuit 180 has a negligible effect on driving Output B during operational State 1. During State 1, Output B may be mostly determined by the first three stack FET circuit 175 in which Output B may be 3.3V.

State 2 occurs when Input A may be at 1.5V, which accordingly produces 1.8V at Output B. During State 2, Output B is determined by the operation of both the first three stack FET circuit 175 and the second three stack FET circuit 180, while in contrast, during State 1, Output B is mainly controlled by the first three stack FET circuit 175.

Input A is connected to the gates 'g' of PFET T150 and NFET T135. In operation, while Input A is at 1.5V, PFET T150 will be in the OFF state (i.e., threshold voltage not exceeded), while NFET T135 will be in the ON State. The drain 'd' of NFET T135 and, therefore point 190, is connected to ground. As illustrated, point 190 is also connected to the source 's' of NFET T130, which will be in the ON state. Point 195 of resistor R110 will be effectively at a low voltage. NFET T130 has its gate 'g' and drain 'd' connected together. The connected gate 'g' and drain 'd' of NFET T130 is also connected to the source 's' of NFET T125. NFET T125 has its gate 'g' and drain 'd' connected together, both of which are coupled to resistor R110 at point 195. While in operation NFET T125 is also in the ON state along with NFETs T130 and T135. Thus, point 195 of resistor R110 will effectively be at a low voltage.

As previously indicated, during State 2, the first three stack FET circuit 175 works with the second three stack FET circuit to produce 1.8V at Output B. The regulated power supply source 102, which produces $V_{R1}$=1.8V, is connected to the gate 'g' of NFET T145, while the source 's' of NFET T145 is connected to resistor R110 at point 185. While the other end (i.e., point 195) of resistor R110 is discharged to a low voltage, NFET T145 is ON during State 2. NFET T140 has its source 's' connected to the drain 'd' of NFET T145, while both the drain 'd' and gate 'g' of NFET T140 are connected to the regulated output voltage $V_{R1}$ set to 1.8V. Therefore, both NFETs T140 and T145 are ON for State 2. The two NFETs T140 and T145 will set point 185 to a threshold voltage value below approximately 1.8V. NFET T120 has its source 's' connected to the regulated 1.8V via switched ON NFETs T140 and T145. NFET T120 has its gate 'g' and drain 'd' connected together along with the drain 'd' of PFET T115 to form Output B. While NFET T120 will be in the ON state, the drain 'd' (i.e., Output B) of NFET T120 will be held at about a threshold voltage value above the voltage present at the source 's' of NFET T120 at point 185. Thus, Output B will be set to about 1.8V based on Input A receiving 1.5V. The Output B in FIG. 1a may correspondingly toggle between 3.3V in State 1 and 1.8V in State 2.

Figure 1B:
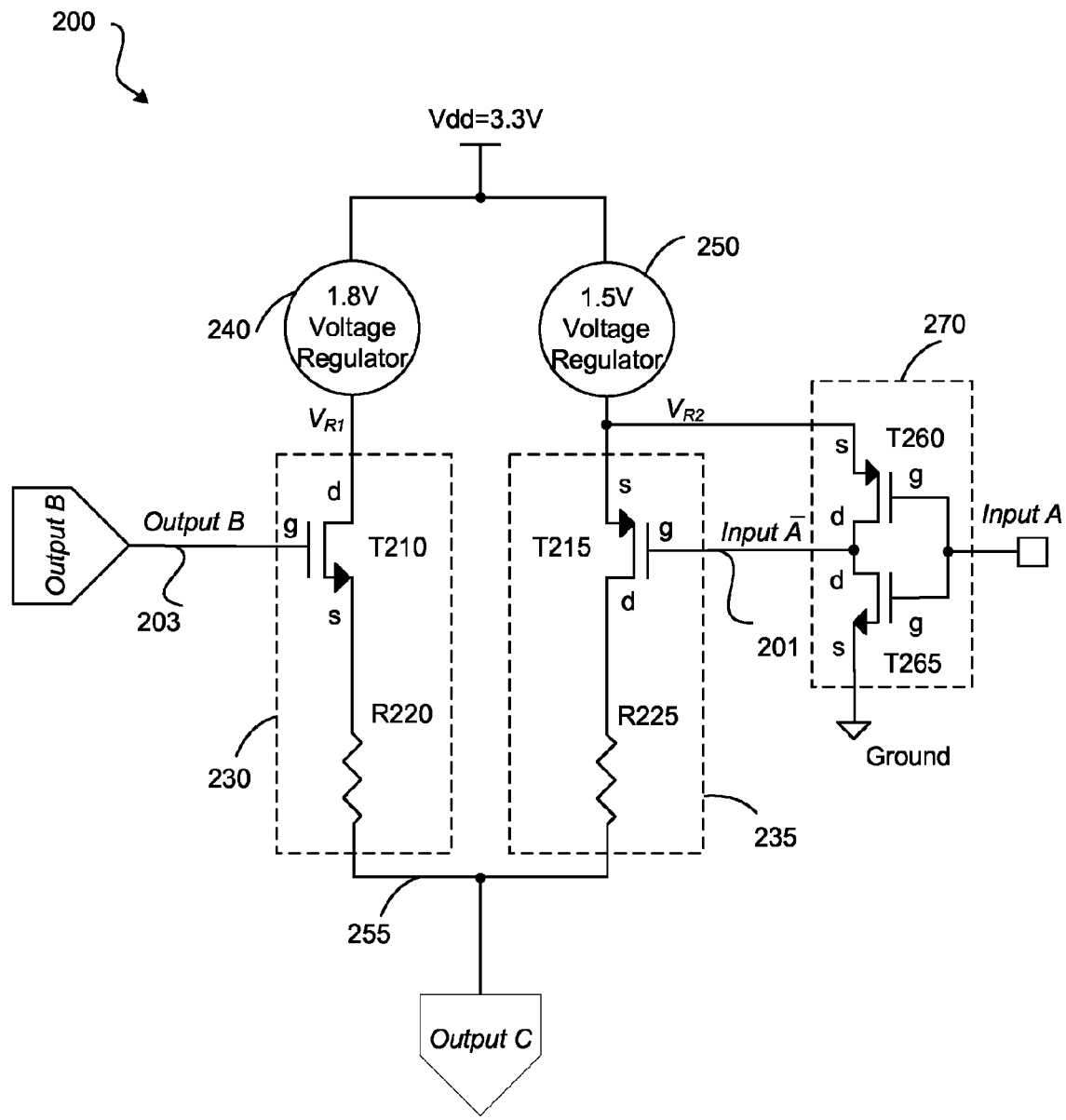
FIG. 1b is another switchable voltage bias generator circuit, according to one exemplary embodiment.

Referring now to FIG. 1b, another switchable voltage bias generator circuit 200 is depicted. In operation, the switchable voltage bias generator circuit 200 switches between either a regulated 1.5V output or a 1.8V regulated output based on both the output and input received from the switchable voltage bias generator circuit 100 of FIG. 1a. The switchable voltage bias generator circuit 200 may include a regulated power supply source 240 (e.g., 1.8V Voltage Regulator), that generates 1.8V, a regulated power supply source 250 (e.g., 1.5V Voltage Regulator), which generates 1.5V, a NFET cascade circuit 230, a PFET cascade circuit 235 and an inverter circuit 270. In this embodiment, there are two inputs (i.e., Input A, Output B). Input A present in the switchable voltage bias generator circuit 100 (FIG. 1a) may toggle between 0V and 1.5V, while Output B generated by the switchable voltage bias generator circuit 100 (FIG. 1a) may toggle between 3.3V and 1.8V. As depicted in FIG. 1b, Input A of the switchable voltage bias generator circuit 100 (FIG. 1a) is received at inverter circuit 270. Inverter circuit 270 will convert Input A to Input $\overline{A}$. Input $\overline{A}$ is connected at input 201 of the PFET cascade circuit 235.

As described above for the switchable voltage bias generator circuit 100 (FIG. 1a), the gate, source and drain of each FET for FIG. 1b may be shown with a 'g', 's' and 'd', respectively, in the figures.

NFET cascade circuit 230 may include NFET T210 and resistor R220. The gate 'g' of NFET T210 is connected at input 203 to Output B generated by the switchable voltage bias generator circuit 100 (FIG. 1a). The drain 'd' of NFET T210 is connected to the regulated 1.8V output (i.e., $V_{R1}$) of regulated power supply source 240. Regulated power supply source 240 is a 1.8V voltage regulated from the 3.3V supply voltage. The source 's' of NFET T210 is connected to resistor R220. Resistor R220 is also connected to point 255 in the switchable voltage bias generator circuit 200. Point 255 connects NFET cascade circuit 230 and PFET cascade circuit 235, which corresponds to the output (i.e., Output C) of the switchable voltage bias generator circuit 200.

Also, PFET cascade circuit 235 may include PFET T215 and resistor R225. The gate 'g' of T215 is connected to Input $\overline{A}$. Input $\overline{A}$ is received from the output of the inverter circuit 270. The source 's' of PFET T215 is connected to the 1.5V regulated output voltage (i.e., $V_{R2}$) generated by regulated power supply source 250, while the drain 'd' of PFET T215 is connected to resistor R225. Regulated power supply source 250 is a 1.5V voltage regulated from the 3.3V supply voltage. The other end of resistor R225 is connected to point 255, which connects NFET cascade circuit 230 and PFET cascade circuit 235, thus forming the output (i.e., Output C) of the switchable voltage bias generator circuit 200.

Inverter circuit 270 may include PFET T260 and NFET T265. The gate 'g' of PFET T260 is connected to Input A and also connected to the gate 'g' of NFET T265. The source 's' of PFET T260 is connected to the 1.5V voltage (i.e., $V_{R2}$) generated by regulated power supply source 250, while its drain 'd' is connected to the drain 'd' of NFET T265 and forms Input $\overline{A}$. Input $\overline{A}$ is fed into PFET cascade circuit 235. The gate 'g' of NFET T265 is connected to Input A and is also connected to the gate 'g' of PFET T260. The source 's' of NFET T265 is connected to ground. The drain 'd' of NFET T265 is connected to the drain 'd' of PFET T260 and this connection point forms Input $\overline{A}$. Input $\overline{A}$ is connected to PFET cascade circuit 235.

Input A is present in the switchable voltage bias generator circuit 200 and is the same Input A present in the switchable voltage bias generator circuit 100. Input A is connected to the input of inverter circuit 270.

The switchable voltage bias generator circuit 200 shown in FIG. 1b receives Input A and Output B described above from the switchable voltage bias generator circuit 100 in FIG. 1a. The switchable voltage bias generator circuit 200 may produce Output C which may toggle between 1.8V during State 1 and 1.5V during State 2 based on the received Input A and Output B voltage values. Table 2 (below) illustrates the voltage levels for Input A, Input $\overline{A}$, Output B and Output C. Table 2 contains information from Table 1 with additional columns Input A and Output C. As shown in Table 2 below, during State 1, when Input A is 0V and Output B is 3.3V, the circuit shown in FIG. 1b may produce an Output C at 1.8V. During State 2 when Input A is 1.5V and Output B is 1.8V, the circuit shown in FIG. 1b may accordingly produce an Output C at 1.5V.

TABLE 2

Operational States of the switchable voltage bias generator circuit 200

| | Input A | Input $\overline{A}$ | Output B | Output C |
|---|---|---|---|---|
| State 1 | 0 V | 1.5 V | 3.3 V | 1.8 V |
| State 2 | 1.5 V | 0 V | 1.8 V | 1.5 V |

In operation, Output C of the switchable voltage bias generator circuit 200 may be determined by either PFET cascade circuit 235 during State 1 or NFET cascade circuit 230 during State 2.

During State 1, (i.e., Input A=0V), Output C (i.e., 1.8V) of the switchable voltage bias generator circuit 200 may be driven by the operation of NFET cascade circuit 230. During State 1, PFET cascade circuit 235 will not influence Output C based on the following. In State 1, Input A is 0V, setting PFET T260 of inverter circuit 270 to an ON state. While Input A is 0V, NFET T265 of inverter circuit 270 is OFF. This results in Input $\overline{A}$ of 1.5V, which feeds into PFET cascade circuit 235. Input $\overline{A}$ at 1.5V will turn PFET T215 OFF. Thus, PFET cascade circuit 235 will not influence Output C during State 1. NFET cascade circuit 230 will control Output C during State 1. Output B will be 3.3V during State 2. Output B is connected to the gate 'g' of NFET T210 and will turn NFET T210 to an ON state. When NFET T210 is ON, Output C may be electrically coupled to the regulated 1.8V voltage (i.e., $V_{R1}$) to resistor R220 and thus Output C. During State 1, Output C may be 1.8V.

During State 2, (i.e., Input A=1.5V), Output C (i.e., 1.5V) of the switchable voltage bias generator circuit 200 may be driven by the operation of PFET cascade circuit 235. During State 2, NFET cascade circuit 230 will not influence Output C based on the following. In State 2, Input A is 1.5V, setting PFET T260 of inverter circuit 270 to an OFF state. While Input A is 1.5V, NFET T265 of inverter circuit 270 is ON. This results in Input $\overline{A}$ of 0V, which feeds into PFET cascade circuit 235. Input $\overline{A}$ at 0V will turn PFET T215 ON. Thus, PFET cascade circuit 235 will control Output C during State 1. When PFET T215 is ON, Output C may be electrically coupled to the regulated 1.5V voltage (i.e., $V_{R2}$) to resistor R225 and thus Output C. During State 2, Output C may be 1.5V. NFET cascade circuit 230 will not control Output C during State 2. Output B will be 1.8V during State 2. Output B is connected to the gate 'g' of NFET T210 and will turn NFET T210 to an OFF state. Thus, NFET T210 of NFET cascade circuit 230 may not electrically couple the regulated 1.8V voltage (i.e., $V_{R1}$) to resistor R220 and thus Output C. PFET cascade circuit 235 will control Output C during State 2 to be 1.5V As previously described, in FIG. 1b, the switchable voltage bias generator circuit 200 may have Output C determined by either PFET cascade circuit 235 or NFET cascade circuit 230. During State 1, NFET cascade circuit 230 may determine Output C to be 1.8V. During State 2, NFET cascade circuit 235 may determine Output C to be 1.5V. This may result in Output C toggling between approximately 1.8V during State 1 and 1.5V during State 2.

The switchable voltage bias generator circuit 200 in FIG. 1b may ensure that the voltage across each transistor does not exceed 1.5V and result in a dielectric breakdown or parasitic bipolar breakdown, as described above.

Figure 1C:
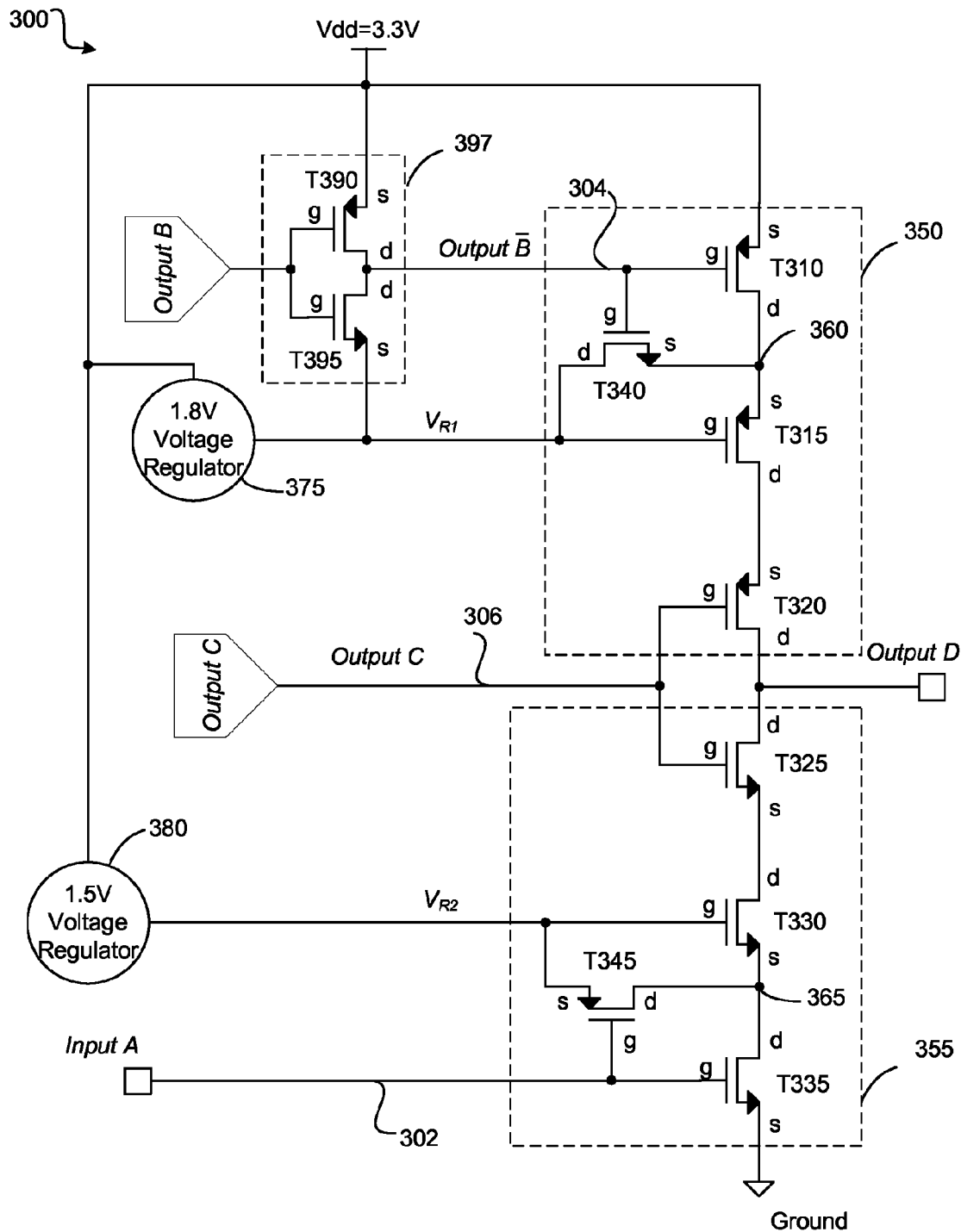
FIG. 1c is an output stage of a push pull driver circuit, according to one embodiment.

Referring to FIG. 1c, an exemplary embodiment of an output stage of a push pull driver circuit 300 is depicted. In operation, the output stage of a push pull driver circuit 300 switches between either a regulated 3.3V or a 0V output based on both the output and input received from the switchable voltage bias generator circuit 100 of FIG. 1a and the switchable voltage bias generator circuit 200 of FIG. 1b. The output stage of a push pull driver circuit 300 embodiment depicted in FIG. 1c may include a pull up circuit 350, a pull down circuit 355, a regulated power supply source 375 (e.g., 1.8V Voltage Regulator), that generates 1.8V, a regulated power supply source 380 (e.g., 1.5V Voltage Regulator), that generates 1.5V, and an inverter circuit 397. Regulated power supply source 375 is a 1.8V voltage regulated from the 3.3V supply voltage. Regulated power supply source 380 is a 1.5V voltage regulated from the 3.3V supply voltage. Output stage of a push pull driver circuit 300 may have three inputs (i.e. Input A, Output B, Output C). Input A present in both the switchable voltage bias generator circuit 100 (FIG. 1a) and the switchable voltage bias generator circuit 200 (FIG. 2a) may toggle between 0V and 1.5V, while Output B generated by the switchable voltage bias generator circuit 100 (FIG. 1a) may toggle between 3.3V and 1.8V. Output C, as generated by the switchable voltage bias generator circuit 200 (FIG. 1b), may toggle between 1.8V and 1.5V.

Input A of the switchable voltage bias generator circuit 100 (FIG. 1a) and the switchable voltage bias generator circuit 200 (FIG. 1b) is received at input 302. Output B of the switchable voltage bias generator circuit 100 (FIG. 1a) and the switchable voltage bias generator circuit 200 (FIG. 1b) is connected to inverter circuit 397. Inverter circuit 397 produces Output $\overline{B}$ which is connected to the input 304 of the pull up circuit 350. Output C of the switchable voltage bias generator circuit 200 (FIG. 1b) is connected directly to the input 306 of both the pull up circuit 350 and the pull down circuit 355.

As described above for FIGS. 1a and 1b, in FIG. 1c the gate, source and drain of each FET may be shown with a 'g', 's' and 'd', respectively in the figures.

Inverter circuit 397 of the output stage of a push pull driver circuit 300 may include PFET T390 and NFET T395. Output B is connected to the gate 'g' of PFET T390. The source 's' of PFET T390 is connected to the 3.3V supply voltage. The drain 'd' of PFET T390 is connected to the drain 'd' of NFET T395 and this connection point forms Output $\overline{B}$. Output B is connected to the pull up circuit 350 at point 304. NFET T395 has its gate 'g' connected to Output B, while the source 's' is connected to the regulated power supply source 375 (i.e., 1.8V). The drain 'd' of NFET T395 is connected to the drain 'd' of PFET T390 and this connection point forms Output $\overline{B}$.

The pull up circuit 350 of the output stage of a push pull driver circuit 300 may include three stacked PFET devices T310, T315, T320, and one bias control device, NFET T340. Output $\overline{B}$ may be connected to both gates 'g' of PFET T310 and NFET T340. The source 's' of PFET T310 is connected to the 3.3V supply voltage. The drain 'd' of PFET T310 is connected to the source 's' of both bias control NFET T340 and PFET T315. This connection point is show as point 360 in FIG. 1c. PFET T315 has a source 's' that is connected to both the source 's' of NFET T340 and the drain 'd' of PFET T310, as indicated at point 360. The gate 'g' of PFET T315 is connected to the regulated power supply source 375 (i.e., 1.8V), while its drain 'd' is connected to the source 's' of PFET T320. PFET T320 has a gate 'g' that is connected to Output C from FIG. 1b. The source 's' of PFET T320 is connected to the drain 'd' of PFET T315. The drain 'd' of PFET T320 is connected to the pull down circuit 355 and this connection point forms Output D. The NFET T340 has a gate 'g' that is connected to Output $\overline{B}$, while the drain 'd' of NFET T340 is connected to regulated power supply source 375 (i.e., 1.8V). The source 's' of NFET T340 is connected to both the drain 'd' of PFET T310 and the source 's' of PFET T315, as indicated in FIG. 1c at point 360. The pull up circuit 350 can also be referred to as a stacked configuration of p-type field effect transistors. NFET T340 can also be referred to as a first transmission gate.

The pull down circuit 355 of the output stage of a push pull driver circuit 300 may include three stacked NFET device T325, T330, T335, and bias control device PFET T345. NFET T325 has a gate 'g' that is connected to Output C from FIG. 1b. The source 's' of NFET T325 is connected to the drain 'd' of NFET T330. The drain 'd' of NFET T325 is connected to the pull up circuit 350 and this connection point forms Output D. NFET T330 has a drain 'd' that is connected to the source 's' of NFET T325. The gate 'g' of NFET T330 is connected to the regulated power supply source 380 (i.e. 1.5V), while the source 's' of NFET T330 is connected to the drain 'd' of both NFET T335 and PFET T345, as defined at point 365. NFET T335 has a drain 'd' that is connected to both the source 's' of NFET T330 and drain 'd' of PFET T345. NFET T335 has a source 's' that is connected to ground and a gate 'g' that is connected to Input A. PFET T345 has a source 's' that is connected to regulated power supply source 380 (i.e., 1.5V) and a gate that is connected to Input A. PFET T345 has a drain 'd' that is connected to both the source 's' of NFET T330 and the drain 'd' of NFET T335.

As depicted in FIG. 1c, circuit 300 utilizes a three 1.5V CMOS FET device stacking scheme. The driver may include a pull up circuit and a pull down output circuit. The pull up circuit 350 and the pull down circuit 355 each may consist of three CMOS FETs in series and one additional FET (i.e., a bias control FET) to prevent the occurrence of dielectric breakdown or parasitic bipolar breakdown. The pull up circuit and the pull down circuit alternate in sourcing current to a connected load. The output stage of a push pull driver circuit 300 may also be called a push pull driver output circuit. As shown, CMOS FETs are stacked (or in series) when the source 's' of one FET is connected to the drain 'd' of a second FET, and the source 's' of the second FET is connected to the drain 'd' of a third FET, etc.

In the output stage of a push pull driver circuit 300 of FIG. 1c, Output D may be driven by either the pull up circuit 350 or the pull down circuit 355.

Table 3 (below) illustrates voltage levels for Input A (FIGS. 1a, 1b), Output B (FIGS. 1a, 1b), Output $\overline{B}$ (FIG. 1c), Output C (FIG. 1b), and Output D (FIG. 1c). Table 3 contains information from Table 1 and Table 2, with an additional columns Output B and Output D.

TABLE 3

Operational states of Output stage of push-pull driver circuit 300

|  | Input A | Output B | Output $\overline{B}$ | Output C | Output D |
| --- | --- | --- | --- | --- | --- |
| State 1 | 0 V | 3.3 V | 1.8 V | 1.8 V | 3.3 V |
| State 2 | 1.5 V | 1.8 V | 3.3 V | 1.5 V | 0 |

Referring to FIG. 1c, in operation, output stage of a push pull driver circuit 300 may have two states, State 1 and State 2. In State 1 when Input A is 0V, Output B is 3.3V, Output $\overline{B}$ is 1.8V, while Output C is 1.8V. All of these voltage levels result in Output D being at 3.3V as described in more detail below. In State 2 when Input A is 1.5V, Output B is 1.8V, Output $\overline{B}$ is 3.3V, and Output C is at 1.5V. All of these voltage levels result in Output D being at 0V as described in more detail below.

Still referring to FIG. 1c, during State 1 when Input A is at 0V, the pull up circuit 350 may be driving Output D. Output D may not be determined in this state by the pull down circuit 355. In State 1, Output D may result in 3.3V. However, State 2 occurs when Input A is at 1.5V, which accordingly results in Output D being at 0V. During State 2, Output D is mainly determined by the operation of the pull down circuit 355.

In operation, inverter circuit 397 will convert Output B to Output $\overline{B}$. When Output B is 3.3V during State 1, inverter circuit 397 will produce Output $\overline{B}$ of 1.8V. Conversely, while Output B is 1.8V during State 2, inverter circuit 397 will produce Output $\overline{B}$ of 3.3V, described in more detail as follows. Output B is connected to the gates 'g' of PFET T390 and NFET T395. During State 1, Output B of 3.3V will turn PFET T390 to the OFF state and will turn NFET T395 to the ON state. When NFET T395 is ON, Output $\overline{B}$ is electrically coupled to regulated power supply source 375 (i.e., 1.8V) and will be 1.8V. During State 2, when Output B is 1.8V, inverter circuit 397 will produce Output B of 3.3V. Output B is connected to the gates 'g' of PFET T390 and NFET T395. During State 2, Output B of 1.8V will turn PFET T390 to the ON state and will turn NFET T395 to the OFF state. When PFET T390 is ON, Output $\overline{B}$ is electrically coupled to supply voltage (i.e., 3.3V) and will be 3.3V. Thus, during State 1, Output B of 3.3V becomes Output $\overline{B}$ of about 1.8V via inverter circuit 397. During State 2, Output B of 1.8V will become Output $\overline{B}$ of about 3.3V via inverter circuit 397.

During State 1, when Output $\overline{B}$ is 1.8V, NFET T340 may be in the OFF state and PFET T310 may be in the ON state. While PFET T310 is in the ON state, this transistor will electrically conduct point 360 to the supply voltage of 3.3V. PFET T315 has its gate 'g' connected to the voltage output $V_{R1}$ (i.e., 1.8V) of regulated power supply source 375 and will therefore also be in the ON state. The drain 'd' of PFET T315 will effectively be connected to 3.3V. The drain 'd' of PFET T315 is connected to the source 's' of PFET T320. During State 1, Output C is approximately 1.8V and is tied to the gate 'g' of PFET T320 of the pull up circuit 350. Thus PFET T320 will be in the ON state along with PFETs T310 and T315. The drain 'd' of PFET T320 will also effectively be connected to 3.3V, resulting in Output D being held at 3.3V during State 1. During State 1, Output D is thus determined by the pull up circuit 350. NFET T340 may therefore may be dynamically switched OFF and does not provide voltage biasing protection for the lower voltage 1.5V CMOS FETs used in the pull up circuit 350.

As shown in FIG. 1c, Input A is connected to the gates 'g' of PFET T345 and NFET T335 in the pull down circuit 345. During State 1 (Output $\overline{B}$=1.8V), PFET T345 may be in the ON state and NFET T335 may be in the OFF state. While PFET T345 is in the ON state, this insures point 365 does not fall below 1.5V to prevent dielectric breakdown or parasitic bipolar breakdown across transistor terminals. Thus, PFET T345 may insure the point 365 in the circuit 300 is held at the 1.5V regulated output $V_{R2}$ of the regulated power supply source 380. Holding the drain 'd' of PFET T345 at 1.5V may thus ensure that the NFETs T325, T330, T335 of pull down circuit 355 do not exceed their respective dielectric breakdown voltage or parasitic bipolar breakdown voltage during the operation of the circuit 300. PFET T345 may therefore may be dynamically switched ON to provide voltage biasing protection for the lower voltage 1.5V CMOS FETs used in the pull down circuit 355. The gate 'g' of NFET T330 is connected to the regulated power supply source 380, $V_{R2}$ (i.e., 1.5V), and thus, is in the OFF state during State 1. The gate 'g' of NFET T325 is connected to Output C. Output C is 1.8V during State 1, resulting in NFET T325 being in the OFF State. Therefore, the pull down circuit 355 does not affect Output D during State 1. The pull down circuit 345 may also be referred to as a stacked configuration of n-type field effect transistors. PFET T345 of the pull up circuit 350 may also be referred to as a transmission gate.

As depicted and previously described, Output $\overline{B}$ is connected to the gates 'g' of PFET T310 and NFET T350 in the pull up circuit 350. During State 2 (Output $\overline{B}$=3.3V), PFET T310 may be in the OFF state and NFET T340 may be in the ON state. While NFET T340 is in the ON state, this insures point 360 does not fall below 1.8V to prevent dielectric breakdown or parasitic bipolar breakdown across transistor terminals. Thus, NFET T340 may insure the point 360 in the circuit 300 is held at the 1.8V regulated output $V_{R1}$ of the regulated power supply source 375. Holding the source 's' of NFET T340 at 1.8V may thus ensure that the PFETs T310, T315, T320 of pull up circuit 350 do not exceed their respective dielectric breakdown voltage during the operation of the circuit 300. NFET T340 may therefore may be dynamically switched ON to provide voltage biasing protection for the lower voltage 1.5V CMOS FETs used in the pull up circuit 350. The gate 'g' of PFET T315 is connected to the regulated output voltage $V_{R1}$ set to 1.8V, and thus, is in the OFF state during State 2. The gate 'g' of PFET T320 is connected to Output C. Output C is 1.5V during State 2, resulting in PFET T320 being in the OFF State. Therefore, the pull up circuit 350 does not affect Output D during State 2.

As depicted, Input A is connected to the gates 'g' of PFET T345 and NFET T335. During State 2, when Input A is 1.5V, PFET T345 may be in the OFF state and NFET T335 may be in the ON state. While NFET T335 is in the ON state, this transistor will electrically conduct point 365 to ground. NFET T330 has its gate 'g' connected to the voltage output $V_{R2}$ (i.e., 1.5V) of regulated power supply source 380 and will therefore also be in the ON state. The drain 'd' of NFET T330 will effectively be connected to ground. The drain 'd' of NFET T330 is connected to the source 's' of NFET T325. During State 2, Output C is approximately 1.5V and is tied to the gate 'g' of NFET T325 of the pull down circuit 355. Thus NFET T325 will be in the ON state along with NFETs T330 and T335. The drain 'd' of NFET T325 will also effectively be connected to ground, resulting in Output D being held at 0V during State 2. During State 2, Output D is thus determined by the pull down circuit 355. PFET T345 may therefore may be dynamically switched OFF and does not provide voltage biasing protection for the lower voltage 1.5V CMOS FETs used in the pull down circuit 355.

The circuits shown in FIGS. 1a, 1b and 1c describe an exemplary embodiment of a circuit which may be used to design 3.3V legacy LVTTL drivers using 1.5V CMOS FET devices. A three device 1.5V complementary metal oxide semiconductor (CMOS) field effect transistor (FET) stacking scheme may be utilized to support 3.3V legacy drivers. The three device stacking scheme may be utilized to reduce the voltage across any one device and may avoid any one device achieving dielectric breakdown voltage or parasitic bipolar breakdown across FET terminals. Dynamically switching voltage bias across CMOS FET may help to mitigate dielectric breakdown or parasitic bipolar breakdown across FET devices.

Figure 2:
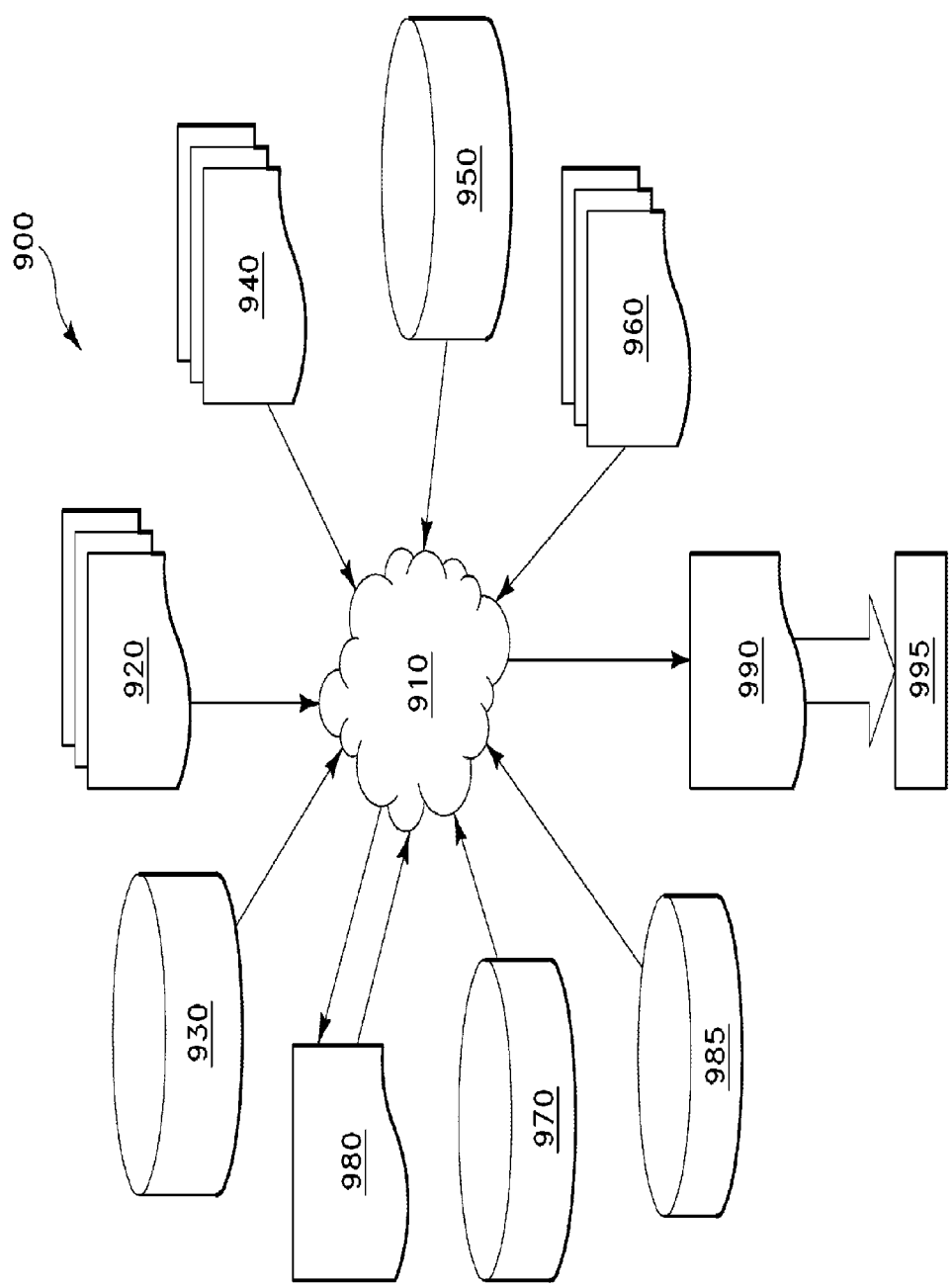
FIG. 2 is a flow diagram of a design process used in semiconductor design, manufacture, and/or test according to an exemplary embodiment.

FIG. 2 shows a block diagram of an exemplary design flow 900 used for example, in semiconductor IC logic design, simulation, test, layout, and manufacture. Design flow 900 includes processes and mechanisms for processing design structures or devices to generate logically or otherwise functionally equivalent representations of the design structures and/or devices described above and shown in FIGS. 1a, 1b and 1c. The design structure processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems.

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 2 illustrates multiple such design structures including an input design structure 920 that is preferably processed by a design process 910. In one embodiment, the design structure 920 comprises design data used in a design process and comprising information describing the embodiments of the invention with respect to the structures as shown in FIG. 1. The design data in the form of schematics or HDL, a hardware-description language (e.g., Verilog, VHDL, C, etc.) may be embodied on one or more machine readable media. For example, design structure 920 may be a text file, numerical data or a graphical representation of the embodiment of the invention shown in FIGS. 1a, 1b and 1c. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as that shown in FIGS. 1a, 1b and 1c. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structure shown in FIGS. 1a, 1b and 1c to generate a netlist 980 which may contain a design structure such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 20, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990 comprising second design data embodied on a storage medium in a data format used for the exchange of layout data of integrated circuits and/or symbolic data format (e.g. information stored in a GDSII (GDS2), GL1, OASIS, map files, or any other suitable format for storing such design structures). In one embodiment, the second design data resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of the embodiments of the invention shown in FIGS. 1*a*, 1*b* and 1*c*. In one embodiment, design structure 990 may comprise a compiled, executable HDL simulation model that functionally simulates the devices shown in FIGS. 1*a*, 1*b* and 1*c*.

Design structure 990 may also employ a data format used for the exchange of layout data of integrated circuits and/or symbolic data format (e.g. information stored in a GDSII (GDS2), GL1, OASIS, map files, or any other suitable format for storing such design data structures).

Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or FIGS. 1*a*, 1*b* and 1*c*. Design structure 990 may then proceed to a stage 995 where, for example, design structure 990: proceeds to tape-out, is released to manufacturing, is released to a mask house, is sent to another design house, is sent back to the customer, etc.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the one or more embodiment, the practical application or technical improvement over technologies found in the marketplace, or to enable others of ordinary skill in the art to understand the embodiments disclosed herein.

What is claimed is:

1. A circuit of an output stage of a push-pull driver having dynamic biasing, the circuit comprising:
   a first stacked configuration of p-type field effect transistors (PFETs) having a first PFET, a second PFET, and a third PFET, wherein the first PFET is connected to a first supply voltage, the third PFET is connected to an output of a first switchable voltage bias generator circuit, and the second PFET is electrically connected between the first PFET and the third PFET; and
   a first transmission gate connected to a second supply voltage, wherein the first transmission gate electrically connects the second supply voltage to an electrical connection between the first PFET and the second PFET based on a first operating state for preventing a first voltage breakdown condition associated with the first stacked configuration of PFETs, and wherein the third PFET is bias controlled via the switching of the output of the first switchable voltage bias generator circuit.

2. The circuit of claim 1, further comprising:
   a second stacked configuration of n-type field effect transistors (NFETs) having a first NFET, a second NFET, and a third NFET, wherein the first NFET is connected to a ground voltage, the third NFET is connected to the output of the first switchable voltage bias generator circuit, and the second NFET is electrically connected between the first NFET and the third NFET; and
   a second transmission gate connected to a third supply voltage, wherein the second transmission gate electrically connects the third supply voltage to an electrical connection between the first NFET and the second NFET based on a second operating state for preventing a second voltage breakdown condition associated with the second stacked configuration of NFETs, and wherein the third NFET in the second stacked configuration of n-type NFETs is bias controlled via the switching of the output of the first switchable voltage bias generator circuit.

3. The circuit of claim 2, wherein the first PFET, the second PFET, the third PFET, the first NFET, the second NFET, the third NFET, the first transmission gate, and the second transmission gate each comprise a 1.5V FET device and, wherein the first supply voltage comprises about 3.3V.

4. The circuit of claim 2, wherein the first supply voltage comprises about 3.3V, the second supply voltage comprises about 1.8V, and the third supply voltage comprises about 1.5V.

5. The circuit of claim 2, wherein the first transmission gate comprises an n-type field effect transistor (NFET), and wherein the second transmission gate comprises a p-type field effect transistor (PFET).

6. The circuit of claim 1, wherein the first voltage breakdown condition comprises at least one of a dielectric breakdown condition and a parasitic bipolar breakdown condition associated with the first stacked configuration of PFETs.

7. The circuit of claim 2, wherein the second voltage breakdown condition comprises at least one of a dielectric breakdown condition and a parasitic bipolar breakdown condition associated with the second stacked configuration of NFETs.

8. The circuit of claim 2, wherein the first switchable voltage bias generator circuit comprises a 1.5V output during the first operating state, and wherein the first switchable voltage bias generator circuit comprises a 1.8V output during the second operating state.

9. The circuit of claim 2, further comprising a control input, wherein during the first operating state the control input receives about a 1.5V input that controls the second transmission gate to an OFF state, and wherein during the second operating state the control input receives about a 0V input that controls the second transmission gate to an ON state.

10. The circuit of claim 9, further comprising a second switchable voltage bias generator circuit that controls the first transmission gate, wherein during the first operating state the second switchable voltage bias generator circuit turn the first transmission gate to an ON state, and wherein during the second operating state the second switchable voltage bias generator circuit turn the first transmission gate to an OFF state.

11. The circuit of claim 10, wherein the second switchable voltage bias generator circuit comprises:
   a third stacked configuration of field effect transistors (FETs) including an output of the second switchable voltage bias generator circuit, wherein during both the first operating state and the second operating state the third stacked configuration of FETs are in an ON state; and a fourth stacked configuration of field effect transistors (FETs), wherein during the first operating state the fourth stacked configuration of FETs are in an ON state, and wherein during the second operating state the fourth stacked configuration of FETs are in an OFF state.

12. The circuit of claim 11, wherein the third stacked configuration comprises:
    a fourth PFET, a fifth PFET and a fourth NFET, wherein the fourth PFET is connected to the first supply voltage, and the electrical connection between the fifth PFET and the fourth NFET forms the output of the second switchable voltage bias generator circuit; and
    a transmission gate pair connected to the second supply voltage, the transmission gate pair electrically connecting the second supply voltage to an electrical connection located between the fourth NFET and a first terminal of a load resistor, wherein the transmission gate pair prevents a third voltage breakdown condition associated with the third stacked configuration of FETs.

13. The circuit of claim 12, wherein the fourth stacked configuration comprises:
    a fifth NFET, a sixth NFET and a seventh NFET, wherein the fifth NFET is connected to ground, the seventh NFET is connected to a second terminal of the load resistor, and the sixth NFET is connected between the fifth NFET and the seventh NFET; and
    a third transmission gate connected to the third supply voltage, the third transmission gate connecting the third supply voltage to an electrical connection located between the fifth NFET and the sixth NFET, wherein the third transmission gate prevents a fourth voltage breakdown condition associated with the fourth stacked configuration of FETs.

14. The circuit of claim 12, wherein the transmission gate pair comprises two n-type field effect transistors (NFETs).

15. The circuit of claim 13, wherein the third transmission gate comprises a p-type field effect transistor (PFET).

16. The circuit of claim 12, wherein the third voltage breakdown condition comprises at least one of a dielectric breakdown condition and a parasitic bipolar breakdown condition associated with the third stacked configuration of FETs.

17. The circuit of claim 13, wherein the fourth voltage breakdown condition comprises at least one of a dielectric breakdown condition and a parasitic bipolar breakdown condition associated with the fourth stacked configuration of FETs.

18. The circuit of claim 13, wherein the first switchable voltage bias generator circuit comprises:
    an NFET cascade connected between the second supply voltage, the output of the second switchable voltage bias generator circuit, and an output of the first switchable voltage bias generator circuit, wherein during the first operating state the output of the second switchable voltage bias generator circuit turns the NFET cascade to an OFF state, and during the second operating state the second switchable voltage bias generator circuit turn the NFET cascade to an ON state, wherein during the ON state the NFET cascade connects the second supply voltage to the output of the first switchable voltage bias generator circuit;
    a PFET cascade connected between the third supply voltage, the output of the second switchable voltage bias generator circuit, and the control input, wherein during the first operating state the control input turns the PFET cascade to an ON state, and during the second operating state the control input turn the PFET cascade to an OFF state, wherein during the ON state the PFET cascade connects the third supply voltage to the output of the first switchable voltage bias generator circuit.

19. The circuit of claim 18, wherein the NFET cascade comprises an eighth NFET and a second resistor, wherein during the first operating state the eighth NFET is in an OFF state, and wherein during the second operating state the eighth NFET is in an ON state and connects the second supply voltage to the output of the first switchable voltage bias generator circuit, and wherein the PFET cascade comprises a sixth PFET and a third resister, wherein during the first operating state the sixth PFET is in an ON state, and wherein during the second operating state the sixth PFET is in an OFF state and connects the third supply voltage to the output of the first switchable voltage bias generator circuit.

20. The circuit of claim 19, wherein the output of the first switchable voltage bias generator circuit includes about a 1.5V output during the first operating state and about a 1.8V output during the second operating state.

\* \* \* \* \*